United States Patent [19]
Lagowski et al.

[11] Patent Number: 5,663,657
[45] Date of Patent: Sep. 2, 1997

[54] DETERMINING LONG MINORITY CARRIER DIFFUSION LENGTHS

[75] Inventors: Jacek Lagowski; Lubek Jastrzebski, both of Tampa, Fla.; Andrzej Kontkiewicz, Warszwawa, Poland; Piotr Edelman, Tampa, Fla.

[73] Assignees: University of South Florida; Semiconductor Diagostics, Inc., both of Tampa, Fla.

[21] Appl. No.: 312,119

[22] Filed: Sep. 26, 1994

[51] Int. Cl.⁶ .................................................. G01R 31/28
[52] U.S. Cl. ........................................ 324/766; 324/750
[58] Field of Search .................................. 324/158.1, 731, 324/760, 765, 767, 750, 96; 437/8; 359/265, 273; 356/400, 401, 368

[56] References Cited

U.S. PATENT DOCUMENTS

| | | | |
|---|---|---|---|
| 4,393,348 | 7/1983 | Goldstein et al. | 324/765 |
| 4,433,288 | 2/1984 | Moore | 324/767 |
| 4,827,212 | 5/1989 | Kamieniecki | 324/158 R |
| 4,851,767 | 7/1989 | Halbout et al. | 324/754 |
| 4,859,939 | 8/1989 | Gittleman et al. | 324/752 |
| 4,891,584 | 1/1990 | Kamieniecki et al. | 324/158 R |
| 5,025,145 | 6/1991 | Lagowski | 250/211 J |
| 5,087,876 | 2/1992 | Reiss et al. | 324/158 D |
| 5,091,691 | 2/1992 | Kamieniecki et al. | 324/158 R |
| 5,126,660 | 6/1992 | Harvey et al. | 324/752 |
| 5,177,351 | 1/1993 | Lagowski | 250/215 |

FOREIGN PATENT DOCUMENTS 58-96255  6/1983  Japan .

OTHER PUBLICATIONS

Semiconductor Diagnostics Activity prior to Sep. 26, 1993.
Phillips; Interpretation of Steady–State Surface Photovoltage Measurements In Epitaxial Semiconductor Layers; Jan. 24, 1972; Solid State Electronics, 1972, vol. 15, pp. 1097–1102.

Saritas et al.; Diffusion Length Studies in Silicon by the Surface Photovoltage Method; Feb. 23, 1987; Solid State Electronics vol. 31, No. 5 pp. 835–842.

Kamieniecki et al.; A New Method for In–line, Real–time Monitoring of Wafer Cleaning Operations; Sep. 19, 1994; UCPSS '94; Bruges Belgium.

Kamieniecki; Surface Photovoltage Measured Capacitance: Application to Semiconductor/Electrolyte System; Nov. 1983; Appl. Phys. 54 (11).

Lagowski et al.; Method for the Measurement of Long Minority Carrier Diffusion Lengths Exceeding Wafer Thickness; Nov. 22, 1993; Appl. Phys. Lett. 63 (21); pp. 2902–2904.

*Primary Examiner*—Vinh P. Nguyen
*Attorney, Agent, or Firm*—Fish & Richardson P.C.

[57] ABSTRACT

Minority carrier diffusion lengths, especially long diffusion lengths that exceed the thickness of the wafer, are determined accurately and conveniently using techniques that limit errors due to lateral carrier diffusion, surface reflectivity, temperature variations, and inherent limitations in standard computation techniques that assume a diffusion length shorter than the wafer thickness. In particular embodiments, a probe is provided that senses the photovoltage in an area spaced from the edge of the illuminated region to provide a measurement substantially free of error from lateral carrier diffusion. The probe may also measure surface reflectivity simultaneously with measurement of photovoltage. Reflectivity correction is particularly beneficial in the analysis of wafers with dielectric coatings.

30 Claims, 14 Drawing Sheets

$I_o$ = Intensity of incident light $I_{eff}$ = Intensity of light entering the semiconductor wafer $I_R$ = Intensity of light reflected from the wafer $I_{RT}$ = intensity of total reflected light monitored by the detector

TABLE I

REFLECTIVITY CORRECTION, I-R', FOR SiO₂ FILM OF DIFFERENT THICKNESS*

| OXIDE THICKNESS (micrometer) | I-R' WAVELENGTH (micrometer) | | | | | | |
|---|---|---|---|---|---|---|---|
| | 1.004 | 0.991 | 0.974 | 0.948 | 0.914 | 0.870 | 0.800 |
| 0.005 | 0.5957 | 0.5958 | 0.5958 | 0.5958 | 0.5958 | 0.5959 | 0.5960 |
| 0.010 | 0.5972 | 0.5973 | 0.5974 | 0.5975 | 0.5976 | 0.5979 | 0.5984 |
| 0.020 | 0.6032 | 0.6034 | 0.6037 | 0.6042 | 0.6048 | 0.6058 | 0.6078 |
| 0.040 | 0.6272 | 0.6281 | 0.6292 | 0.6311 | 0.6339 | 0.6379 | 0.6457 |
| 0.060 | 0.6676 | 0.6695 | 0.6721 | 0.6764 | 0.6826 | 0.6917 | 0.7093 |
| 0.080 | 0.7239 | 0.7273 | 0.7319 | 0.7394 | 0.7501 | 0.7657 | 0.7952 |
| 0.100 | 0.7937 | 0.7986 | 0.8053 | 0.8160 | 0.8310 | 0.8523 | 0.8902 |
| 0.120 | 0.8698 | 0.8757 | 0.8836 | 0.8959 | 0.9125 | 0.9341 | 0.9662 |
| 0.130 | 0.9062 | 0.9121 | 0.9198 | 0.9316 | 0.9468 | 0.9649 | 0.9860 |
| 0.150 | 0.9648 | 0.9690 | 0.9742 | 0.9810 | 0.9874 | 0.9901 | 0.9759 |
| 0.200 | 0.9496 | 0.9422 | 0.9316 | 0.9132 | 0.8852 | 0.8433 | 0.7675 |
| 0.250 | 0.7711 | 0.7594 | 0.7441 | 0.7210 | 0.6916 | 0.6567 | 0.6133 |
| 0.300 | 0.6337 | 0.6270 | 0.6191 | 0.6088 | 0.5993 | 0.5954 | 0.6165 |
| 0.350 | 0.5960 | 0.5975 | 0.6009 | 0.6096 | 0.6282 | 0.6677 | 0.7768 |
| 0.400 | 0.6586 | 0.6710 | 0.6896 | 0.7233 | 0.7773 | 0.8614 | 0.9800 |
| 0.450 | 0.8170 | 0.8396 | 0.8699 | 0.9156 | 0.9659 | 0.9895 | 0.8807 |
| 0.500 | 0.9768 | 0.9856 | 0.9902 | 0.9799 | 0.9340 | 0.8342 | 0.6680 |
| 0.550 | 0.9316 | 0.9078 | 0.8725 | 0.8132 | 0.7353 | 0.6515 | 0.5954 |
| 0.600 | 0.7494 | 0.7233 | 0.6916 | 0.6499 | 0.6115 | 0.5957 | 0.6811 |
| 0.750 | 0.6733 | 0.7000 | 0.7417 | 0.8188 | 0.9269 | 0.9883 | 0.7583 |

*CALCULATED FROM Eqn. 9

FIG. 10

DETERMINING LONG MINORITY CARRIER DIFFUSION LENGTHS

FIELD OF THE INVENTION

This invention relates to determining minority carrier diffusion lengths, particularly long minority carrier diffusion lengths that exceed the wafer thickness.

BACKGROUND OF THE INVENTION

The performance and reliability of semiconductor electronic and optoelectronic devices, and the integrated circuits into which they are incorporated, depends upon the purity of the semiconductor from which the devices are made, and, in particular, on the level of heavy metal contaminants (e.g., Fe, Cr) which may be introduced during manufacture and processing. One measure of contamination that is used in quality control is the minority carrier diffusion length. This parameter is the effective distance that excess carriers diffuse through a semiconductor during their lifetime. The diffusion length gives a measure of the contaminant concentration because heavy metals are recombination centers which reduce carrier lifetime.

In the most common techniques for measuring diffusion length, light is directed by a probe onto a semiconductor to create a surface photovoltage which is detected and analyzed. The photovoltage is created when the energy of the incident photons is above the semiconductor band gap so that excess carriers (holes and electrons) are produced. As a result of the photogeneration and diffusion processes, electron-hole pairs reach the region near the surface and become separated by the electric field of the surface-space charge region, thus producing the surface photovoltage. The photovoltage is typically detected by an electrode that is placed close to the semiconductor surface. The electrode is typically made of a conducting transparent material so that the light which produces the excess carriers can be passed through it.

The American Society for Testing and Materials (ASTM) recommends two methods for analyzing photovoltage to determine diffusion length. In both of these methods, the diffusion length calculation is based on an equation for excess minority carrier concentration at the surface which assumes that the diffusion length is short compared to wafer thickness and that the light penetration depth is less than or equal to one-third the wafer thickness. This expression is:

$$\Delta n = \Phi \frac{(1-R)}{D/L + S} \cdot \frac{1}{1 + \alpha^{-1} L^{-1}} \quad (1)$$

where $\Delta n$ is the excess minority carrier concentration, L is the diffusion length, $\alpha$ is the absorption coefficient ($\alpha^{-1}$ is the penetration depth), $\Phi$ is the incident photon flux, R is the reflectivity of the semiconductor, D is the minority carrier diffusion constant, $D=kT/q\mu$, where k is Boltzman's constant, T is the temperature, q is the elemental charge, $\mu$ is the minority carrier mobility, and S is the surface recombination velocity on the front surface of the semiconductor. This expression is derived in Moss, *J. Electronics and Control*, 1, 126, (1955).

In the constant magnitude method, one of the ASTM-recommended methods, the relationship between carrier concentration and the photovoltage is assumed to be a monotonic function. For several different wavelengths of light, the photovoltage signal is adjusted to a constant value by adjusting the photon flux. The method assumes that the carrier concentration is constant because the photovoltage is constant. The diffusion length is then obtained, using Equation (1), from a plot of the photon flux, $\Phi$, as a function of the light penetration depth $\alpha^{-1}$, where the diffusion length is the intercept value, $L=-\alpha^{-1}_{int}$ at $\Phi=0$. The constant magnitude method is further discussed, for example, in Goodman *J. Appl. Phys. Vol.* 33, p. 2750, 1961, ANSI/ASTM F-391-78, p. 770, 1976, and U.S. Pat. No. 4,337,051.

The second ASTM-recommended method, the linear constant photon flux, relies on measurement for several different wavelengths of light at a very low intensity where the photovoltage is a linear function of the photon flux and where parameters on the right side of the equation (1) are substantially constant. Under such conditions, photovoltage is directly proportional to carrier concentration, or V=const ($\Delta n$), where the constant depends on the semiconductor doping and the surface charge, but does not depend on the photon flux. The effective photon flux entering a semiconductor, $\Phi_{\it{eff}}=\Phi(1-R)$, is constant for all wavelengths and, thus, for all penetration depths, $\alpha^{-1}$. The diffusion length is obtained by plotting the inverse of the photovoltage signal, $\Phi_{\it{eff}}/V$, as a function of penetration depths, $\alpha^{-1}$, and diffusion length is obtained as an intercept value, $L=-\alpha^{-1}_{int}$ at $\Phi_{\it{eff}}/V=0$. This method is further discussed in patents to Lagowski, U.S. Pat. No. 5,025,145 and U.S. Pat. No. 5,177,351 and in L. Jastrzebski et al., *Solid State Technol.* 35, 27 (1992)) and J. Lagowski et al., *Semicond. Sci. Technol.* 7, A185 (1992).

These techniques have proven satisfactory for many analyses in which the diffusion length is short compared to wafer thickness.

SUMMARY OF THE INVENTION

The present inventions improve the measurement of minority carrier diffusion lengths, particularly in the cases of long diffusion lengths that exceed the thickness of the wafer.

In an aspect, the invention features a probe for measuring the effect of charge carriers at the surface of a semiconductor sample. The probe includes a substrate constructed to be placed in proximity with the semiconductor surface for directing energy over an area to excite charge carriers and create a surface charge effect. The substrate further includes a detection element spaced from the edge of the substrate for detecting the charge carrier effect substantially free of the lateral diffusion of carriers from the excited area of the semiconductor.

Embodiments may include one or more of the following. The surface charge effect is a surface photovoltage and the probe substrate is a transparent substrate for directing light onto the semiconductor sample the probe substrate further includes a detection element in the form of a transparent electrode material covering a portion of the transparent substrate for detecting the photovoltage. The transparent electrode material is spaced from the edge of the substrate by a distance that exceeds the diffusion length of the semiconductor. The transparent electrode material is in the form of a continuous circular region having a diameter $d_1$, the substrate has a diameter $d_2$, and the probe satisfies the relationship: $(d_2-d_3)/2 > L$, where L is the diffusion length. The probe is constructed for measurement of semiconductors with a diffusion length of about 1 mm or more. A probe where $d_3$ is about 6 mm.

In another aspect, the invention features a device for measuring photovoltage at the surface of a semiconductor sample. The device is a probe including an electrode that can be positioned in proximity with the surface. The probe is further constructed to both direct radiation onto the surface and receive radiation reflected from the surface. The probe includes a fiber optic bundle including a first series of fibers having one end arranged to receive radiation from a source and another end arranged in proximity with the semiconductor surface to direct the radiation onto the surface to induce the photovoltage. The fiber optic bundle includes a second series of fibers having one end in proximity to the surface to receive radiation reflected from the surface. The second series of fibers has a second end to direct the reflected radiation onto a detector.

Embodiments may also include one or more of the following. The first and second series of fibers are intertwined at the respective ends in proximity with the surface and separated at the respective other ends. The electrode is a transparent electrode and excitation radiation and reflected radiation pass through the transparent electrode.

In another aspect, the invention features a probe combining aspects discussed above. For example, the probe may be a device for measuring photovoltage and reflectivity of the surface of a semiconductor. The device includes a probe with a transparent substrate for directing light over an area of the semiconductor to excite charge carriers and create a surface photovoltage. The substrate further includes a transparent electrode spaced from the edge of the substrate by a distance that exceeds the diffusion length of the semiconductor for detecting the photvoltage substantially free of lateral diffusion of carriers from the excited area of the semiconductor. The probe also includes a fiber optic bundle having a first series of fibers with one end arranged to receive radiation from a source and another end arranged in proximity with the semiconductor surface to direct the radiation onto the surface to induce the photovoltage. The fiber optic bundle includes a second series of fibers having one end in proximity to the surface to receive radiation reflected from the surface. The second series of fibers has a second end to direct the reflected radiation onto a detector.

In another aspect, the invention features a method of analyzing semiconductor samples by determining minority carrier diffusion length. The method includes illuminating a region of the semiconductor with light at a series of wavelengths, the intensity of the light being substantially at a level where photovoltage is a linear function of the flux. The method also includes analyzing photovoltages from the illuminating step to determine diffusion length by fitting to the expressions set forth by equations (5) and (6), infra.

Embodiments may also include one or more of the following features. The step of determining whether back surface recombination velocity is large compared to the minority carrier diffusion velocity, i.e. $S_b \gg D/L$, where D is the minority carrier diffusion constant, by plotting surface photovoltage as a function of penetration depth and determining whether the function is concave or convex. The step of analyzing when the function is concave by assuming $S_b \gg D/L$, so that fitting parameter B reduces to equation (7), infra and, fitting L to determine diffusion length. The step of analyzing when the function is convex by fitting the fitting parameter B and L to determine diffusion length. The step of correcting $\Phi_{eff}$ for reflectivity of the semiconductor surface where $R=(1-n_2)^2/(1+n_2)^2$, where $n_2$ is the refractive index and replacing $V/\Phi_{eff}$ by equation (9), infra. The step of measuring the reflectivity simultaneously with illuminating the wafer and correcting for reflectivity by determining a correction factor as set forth in equation (10), infra. The step of correcting $\Phi_{eff}$ for reflectivity for a semiconductor including a known coating with a known refractive index and thickness by reflectivity using the thin film formula as set forth in equation (11), infra. The step of correcting penetration depth for temperature variations according to equation (12), infra. The step of detecting the photovoltages in a subregion spaced from the edges of the illuminated region, e.g., where the illuminated region has a diameter, $d_2$, and the subregion a diameter, $d_1$, and is spaced from the edge of the region such that $(d_2-d_3)/2>L$.

The inventions have many advantages. For example, they make possible convenient, accurate, and rapid, minority carrier diffusion length measurements and mapping directly from high performance, high purity semiconductor wafers that are used in advanced integrated circuits, e.g. gigabit integrated circuits, in which heavy metals must be monitored at concentrations as low as $10^9$ atoms/cm$^3$ at various stages of fabrication. The corresponding diffusion lengths are about 1 mm, which exceeds typical wafer thicknesses of 725 µm or less. In cases such as these, the standard diffusion length methods can lead to erroneous results.

In embodiments, measurement of diffusion length is improved by minimizing error from lateral diffusion of carriers from beneath the probe detector, which is a particularly important factor in measurements of ultrapure, long diffusion length wafers where carrier mobility is high and lifetimes are long. Depletion of carriers from beneath the probe can lead to measurement error because the photovoltage may no longer be directly proportional to carrier concentration and because the photovoltage dependence on penetration depth varies from the one dimensional case, which is assumed by diffusion length computation schemes. Errors due to lateral diffusion can be reduced by using a probe that measures the photovoltage from a small area within a larger illuminated region. Lateral diffusion may deplete the carriers near the edges of the illuminated region but in the interior of the illuminated region the carrier population is substantially constant.

Another important advantage of embodiments of the invention is the correction of the diffusion length calculations for surface reflectivity. The surface reflectivity can be determined to correct for variations from spot to spot by using a probe that measures surface reflectivity simultaneously with measurement of photovoltage. This feature is particularly important in cases where wafers include front surface coatings, such as $SiO_2$.

The measurements of diffusion length can also be corrected for temperature variations. Moreover, in the case of long diffusion lengths, the diffusion length is calculated using a set of assumptions that do not require that the wafer be thicker than the diffusion length. In a particularly impatient case, the system determines whether back surface recombination velocity is significant and varies the calculation accordingly.

Further features, aspects, and advantages follow. For example, the invention includes a system constructed to perform the methods discussed above.

BRIEF DESCRIPTION OF THE DRAWING

FIG. 1 is a side view of a probe of conventional design and an illustration of the carrier concentration as a function of probe diameter, while

FIG. 4 is a more detailed cross-sectional side view of a probe according to the invention incorporating the features of FIGS. 2 and 3, while

FIG. 10 is a plot of inverse photovoltage as a function of penetration depth for different wafer thicknesses using a standard computation technique;

DESCRIPTION OF THE PREFERRED EMBODIMENTS

Probe and System

Figure 1A:
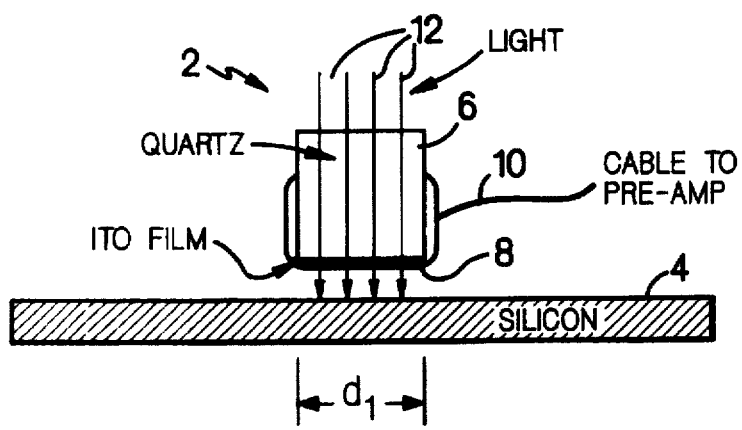
FIG. 1a is an end-on view of the probe.
Figure 1A:
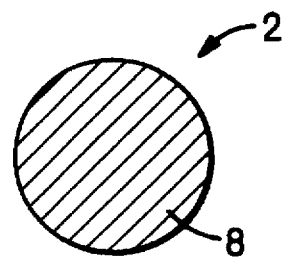
Figure 1:
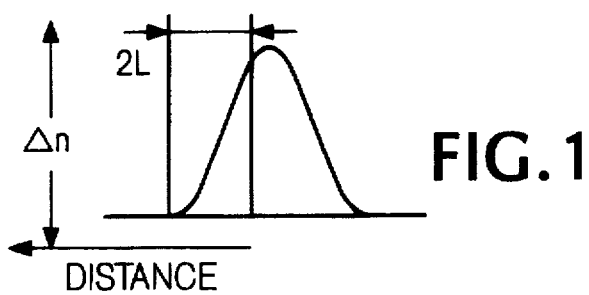

Referring to FIGS. 1 and 1a, a photovoltage probe 2, for measuring photovoltage on a silicon wafer 4, includes a quartz substrate 6. A transparent electrode material 8, such as an ITO film, is provided on the substrate 6 facing the wafer surface. The electrode material 8 is connected via a cable 10 to preamplifier electronics (not shown). Light (arrows 12) from a source (not shown) is directed through the quartz substrate 6, the transparent electrode 8, and onto the surface of the silicon wafer 4 where a photovoltage is generated. The photovoltage is sensed by the transparent electrode material 8 and the signal relayed via cable 10 to the detection electronics. As illustrated in FIG. 1a, the transparent electrode material 8 covers the entire face of the quartz substrate 6. The substrate and electrode material have a diameter, $d_1$, which also substantially corresponds to the diameter of the spot on the wafer surface illuminated by the probe. A probe of this design is taught in Lagowski U.S. Pat. No. 5,177,351.

Referring back to FIG. 1, as illustrated in the graph, upon illumination, the concentration of photogenerated excess carriers, $\Delta n$, is not constant under the probe due to the diffusion of carriers away from the probe edges in directions lateral to the beam direction. Two errors result. First, the photovoltage measured by the probe is not proportional to the excess carrier concentration, $\Delta n$, but becomes a function of the ratio of the diffusion length to the probe diameter, $2L/d_1$ and proportional to an integral:

$$\frac{2}{d_1} \int_{d_1/2}^{0} V(r)dr \quad (2)$$

where V(r)=const. $\Delta n(r)$, r is the distance along the wafer radius. Second, the dependence of carrier concentration, $\Delta n$, on the light penetration depth, z (and, thus, also the dependence of photovoltage on penetration depth), deviates from the one-dimensional case, which is assumed by standard diffusion length calculation schemes. These errors become especially important when the diffusion length, L, is a substantial fraction of the illumination spot or probe radius, $d_1/2$. For example, a typical illumination spot and probe diameter is about 6 mm. Thus, for a long diffusion length of 1 mm, the $2L/d_1$ ratio exceeds 30%.

Figure 2A:
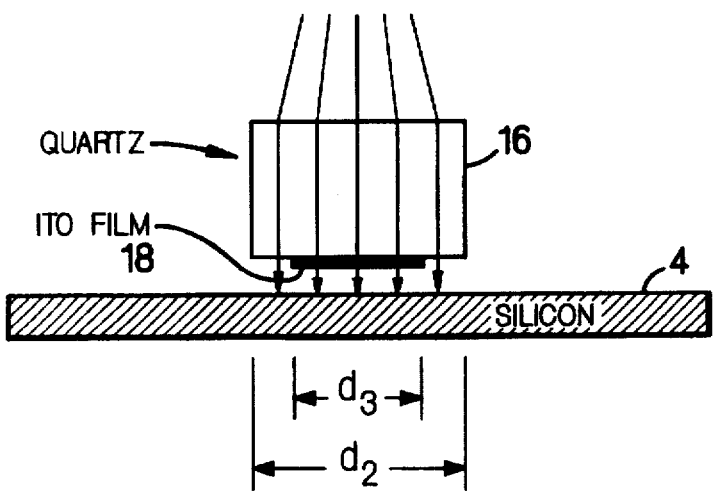
FIGS. 2 and 2a are views similar to those given in FIGS. 1 and 1a but for a probe according to the invention that reduces errors due to lateral diffusion.
Figure 2A:
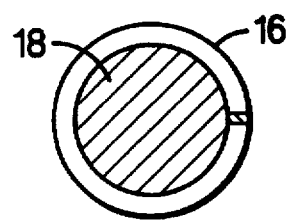
Figure 2:
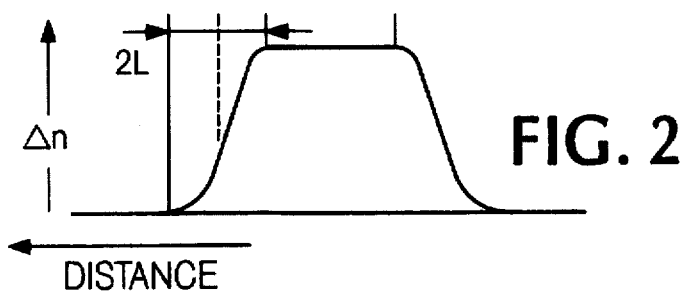

Referring to FIGS. 2 and 2a, a probe according to the invention includes a quartz substrate 16 of a diameter, $d_2$, again, corresponding substantially to the illuminated spot diameter on the wafer. A transparent electrode material 18 is provided in a circular region of diameter, $d_3$, smaller than $d_2$. The electrode material 18 is spaced from the edge of the illuminated spot.

Referring to the graph in FIG. 2, the excess carrier distribution, $\Delta n$, is affected by lateral diffusion near the edges of the quartz substrate. However, in the interior portions, corresponding to the location of the electrode material, the carrier concentration, $\Delta n$, is substantially constant.

In embodiments, the probe is constructed to satisfy the condition that the spacing of the electrode material from the edges of the illuminated region or substrate diameter exceeds the diffusion length, i.e., $(d_2-d_3)/2>L$. In a typical case, the electrode material diameter, $d_3$, is about 6 mm and the quartz substrate diameter, $d_2$, is 12 mm, such that $(d_2-d_3)/2=3$ mm. These dimensions are satisfactory for measurements of diffusion lengths up to 3 mm, while keeping the size of the probe small so that the wafer can be mapped.

Figure 3:
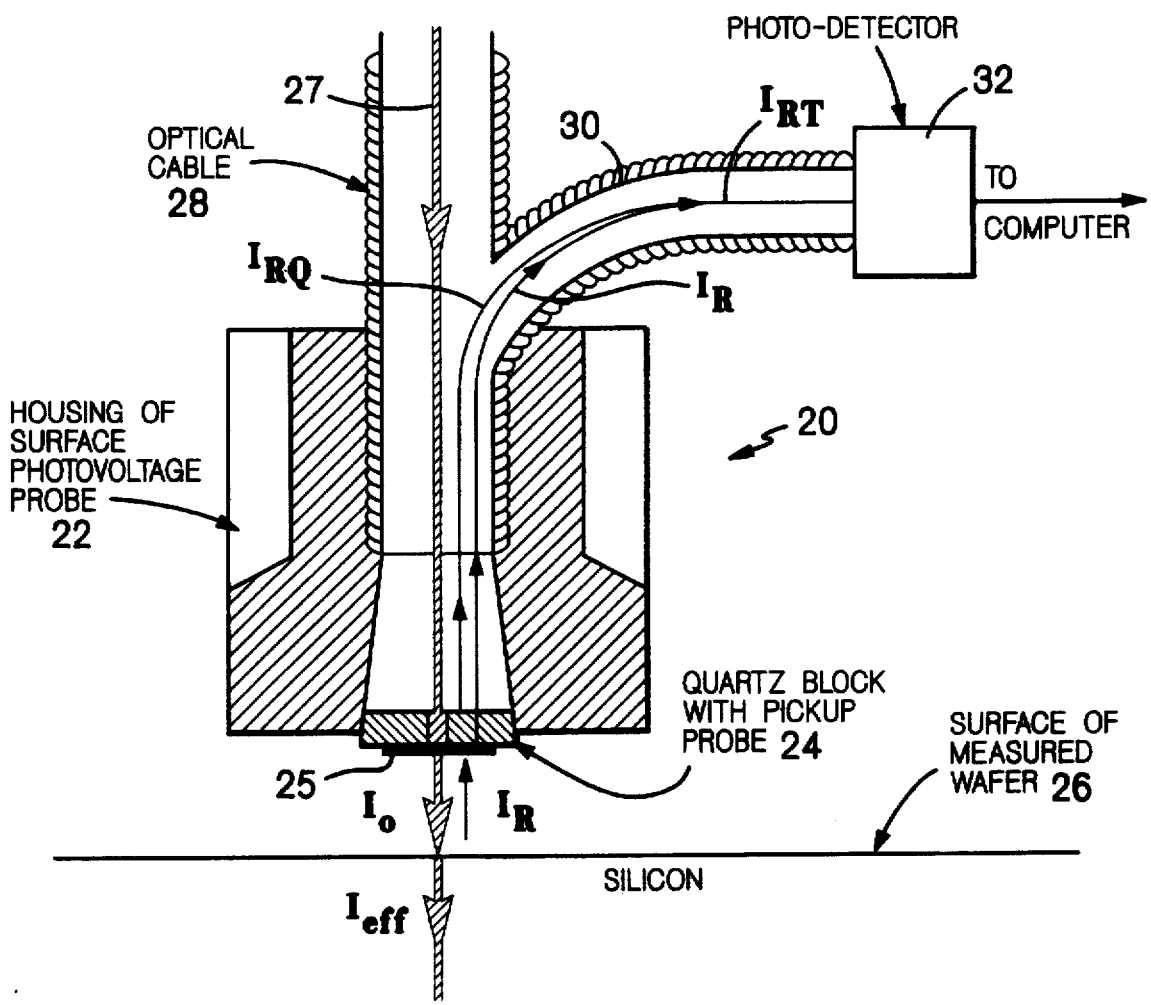
FIG. 3 is a cross-sectional side view of a probe according to the invention that permits simultaneous photovoltage and sample reflectivity measurement.

Referring to FIG. 3, a probe 20 is illustrated that permits detection of wafer surface reflectivity simultaneously with the measurement of photovoltage. The probe 20 includes a housing 22 supporting a quartz substrate 24 including a transparent electrode 25 that is positioned above the surface of a wafer 26. A beam 27 is directed from a source (not shown) by an optical fiber bundle 28 through the substrate 24 to the wafer surface at an intensity, $I_0$. The fiber bundle 28 also includes a y-junction with a leg 30. Light reflected from the wafer surface, $I_R$, and from the back surface of the quartz block, $I_{RQ}$, is returned through the leg 30 of the y-junction to a photodetector 32 which produces a signal indicative of the total reflected intensity, $I_{RT}$. This signal is recorded and analyzed by a computer to correct the photovoltage measurement for changes in reflectivity as will be further discussed below.

Figure 4:
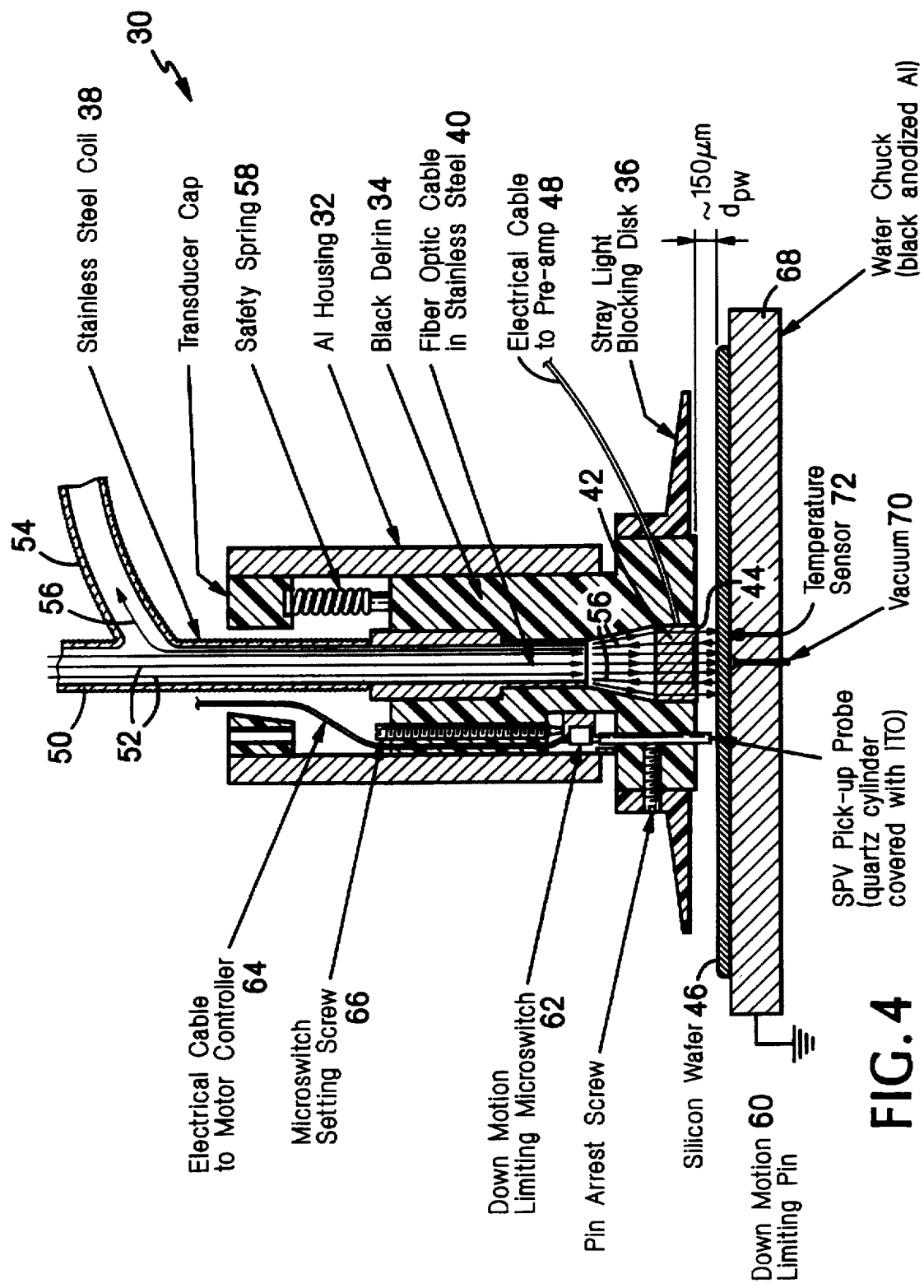
Figure 4A:
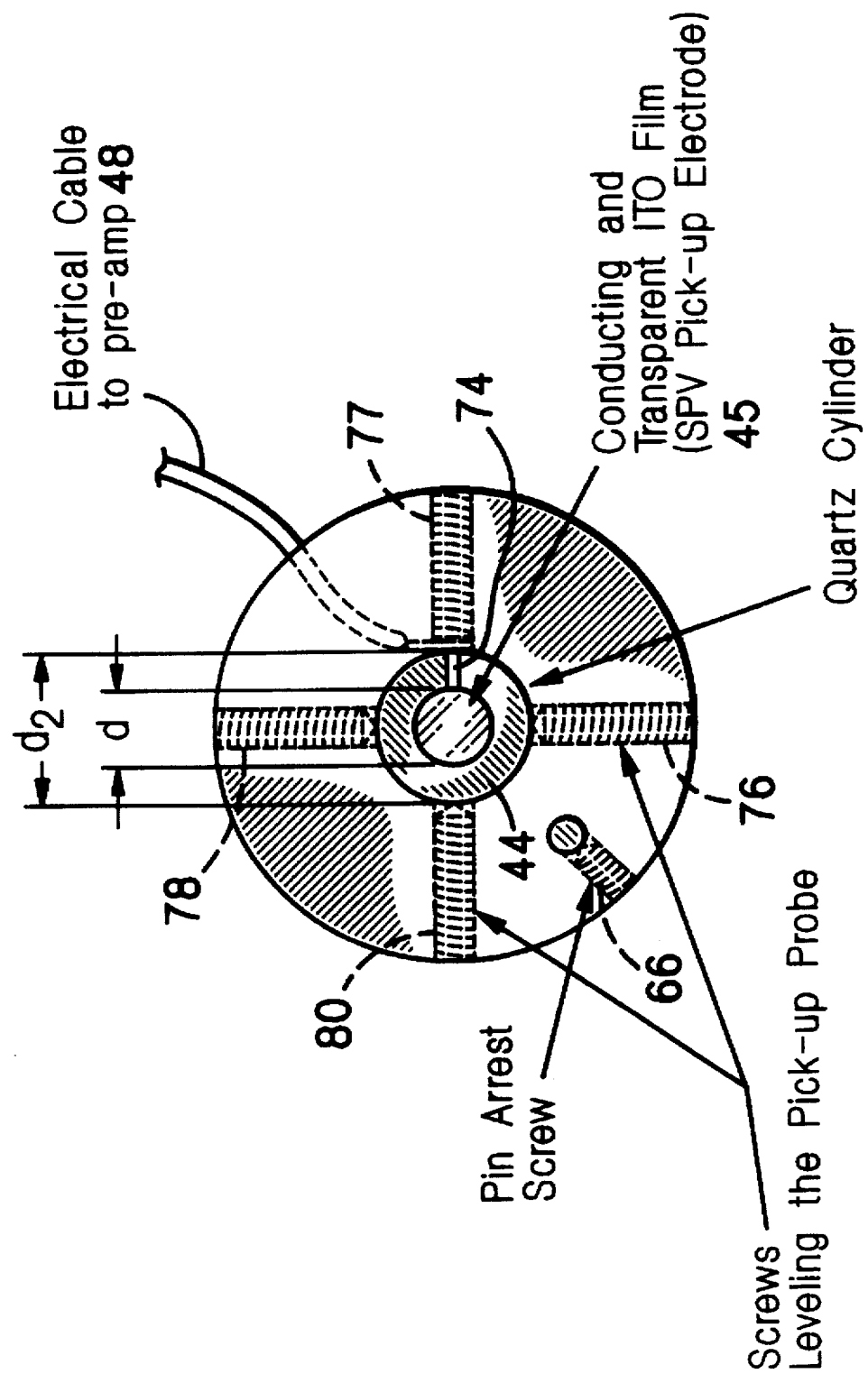
FIG. 4a is an end-on view of the probe in FIG. 4.

Referring as well to FIGS. 4 and 4a, a particular probe 30 is shown including the features illustrated in FIGS. 2-3. The probe 30 includes an aluminum housing 32 supporting a black Delrin® body 34 that extends beyond the housing 32 to form a stray light blocking disc (diameter about 1.25 inch). The probe 30 also includes a central lumen in which an optical fiber bundle 40 is positioned. The fiber bundle is protected by a stainless steel coil 38. The fiber bundle 40 terminates above a quartz substrate 42 (diameter $d_2$ about 0.5 inch) which has an exposed end 44 that faces the wafer 46. The end 44 of the quartz substrate includes a layer of transparent electrode material, such as ITO, that covers a portion of the substrate.

Referring as well to FIG. 4a, an end-on view of the probe, the transparent electrode material 45 covers a portion, $d_3$, for example, about 0.25 inch, of the surface 44 of the quartz substrate. A narrow bridge 74, about 0.1 inch, of transparent conducting material leads to the edge of the quartz substrate, which is coated with conducting material to allow connection with electrical cable 48 (phantom) leading to system electronics to be further described below. The probe includes levelling screws 76–80 (shown in phantom), in the Delrin about 0.125 inch from the bottom of the probe, that can be adjusted to level the quartz block with respect to the wafer surface.

Referring back to FIG. 4, above the probe 30, the fiber bundle 40 includes a y-junction with a first leg 50 to direct light (arrows 52) from a source (not shown) to illuminate the wafer. The second leg 54 directs reflected light (arrows 56) to a detector for monitoring surface reflectivity. The fiber bundle with the y-junction is formed by intertwining fibers at the end of the bundle that is placed opposite the substrate and separating some of the fibers at the junction. (Fiber bundles of this type are commercially available, for example, Model SDI265, Cuda Products, Inc., Jacksonville, Fla.)

The probe 30 also includes a safety spring 58 that allows the lower portions of the probe to recoil into the aluminum housing should the probe come in contact with the wafer. The probe further includes a down-motion limiting pin 60 that is disposed should it engage the wafer. In such a case, the limiting pin activates a microswitch 62 which sends a signal through cable 64 to a height controller. The limiting switch is adjusted by a setting screw 66. Typically, the probe is positioned so that the quartz substrate is about 150 µm above the wafer 46.

The wafer 46 is provided on a grounded wafer chuck 68 formed of black anodized aluminum. The chuck is provided with a vacuum 70 source to draw the wafer to its surface and stabilize the wafer during measurement. The chuck may also include a temperature sensor 72, such as a thermocouple, to measure actual wafer temperature, which can be accounted for in the diffusion length measurements as will be discussed below. In alternate embodiments, temperature can be monitored by a pyroelectric sensor attached to or placed adjacent to the probe. In a particular alternative embodiment, the pyroelectric detector is positioned remotely from the probe but receives light from the wafer through a fiber optic bundle.

Figure 5:
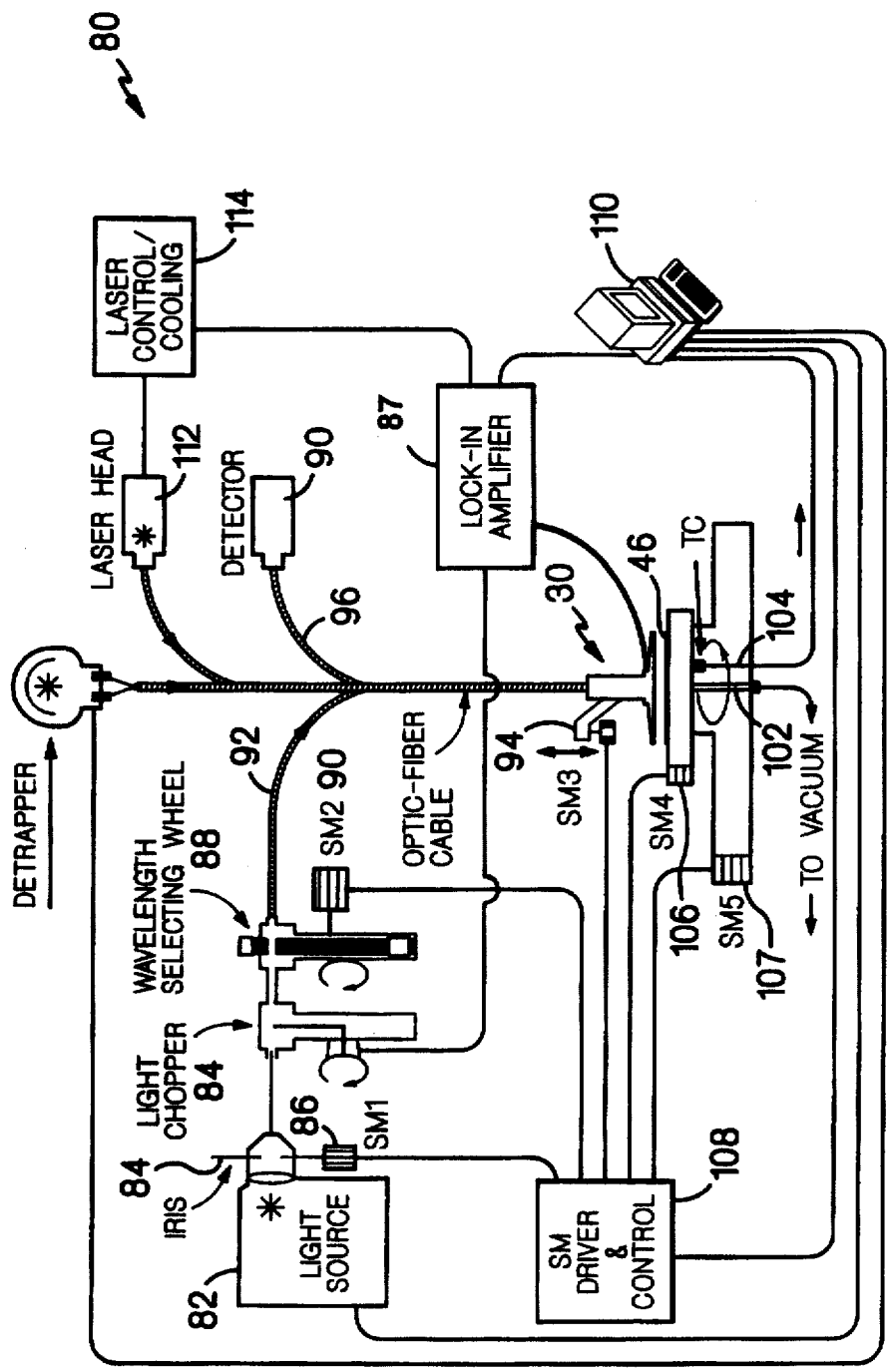
FIG. 5 is a system schematic.

Referring to FIG. 5, the probe 30 is part of a system 80 for measuring diffusion length of a wafer 46. The system 80 includes a light source 82 with an iris aperture 84 that is controlled by a stepping motor 86. Light from the source 82 is directed through a chopper 84 which is connected to a lock-in amplifier 87. A wavelength selecting wheel 88, controlled by a stepper motor 90, provides variation in the wavelength of light. The light is directed along a fiber optic bundle 92 to the probe and then to the wafer surface 81. The optical fiber includes leg 96 which leads to a detector 98 for detection of reflected light. The detector 98 is also connected to the lock-in amplifier 86. The fiber bundle may also include branches that lead from a detrapper light source 99 and to a laser head 112. The detrapper 99 provides a constant flux of light to saturate semiconductor traps so that excess carriers can be generated. The laser 112 and a laser control and cooling mechanism 114 can be used for absolute measurements of surface potential to provide surface charge images.

The height of the probe above the surface is controlled by a stepper motor 94. The wafer 81 is provided on a chuck including vacuum source 102 and temperature measuring element 104. The wafer can be translated beneath the probe by a stepper motor 106 or rotated by a stepper motor 107. The stepper motors are all controlled by a stepper motor driver and control 108. The driver and light source are controlled by a computer 110. The computer 110 also receives photovoltage signal generated for each wavelength of light imposed on the wafer.

Figure 6:
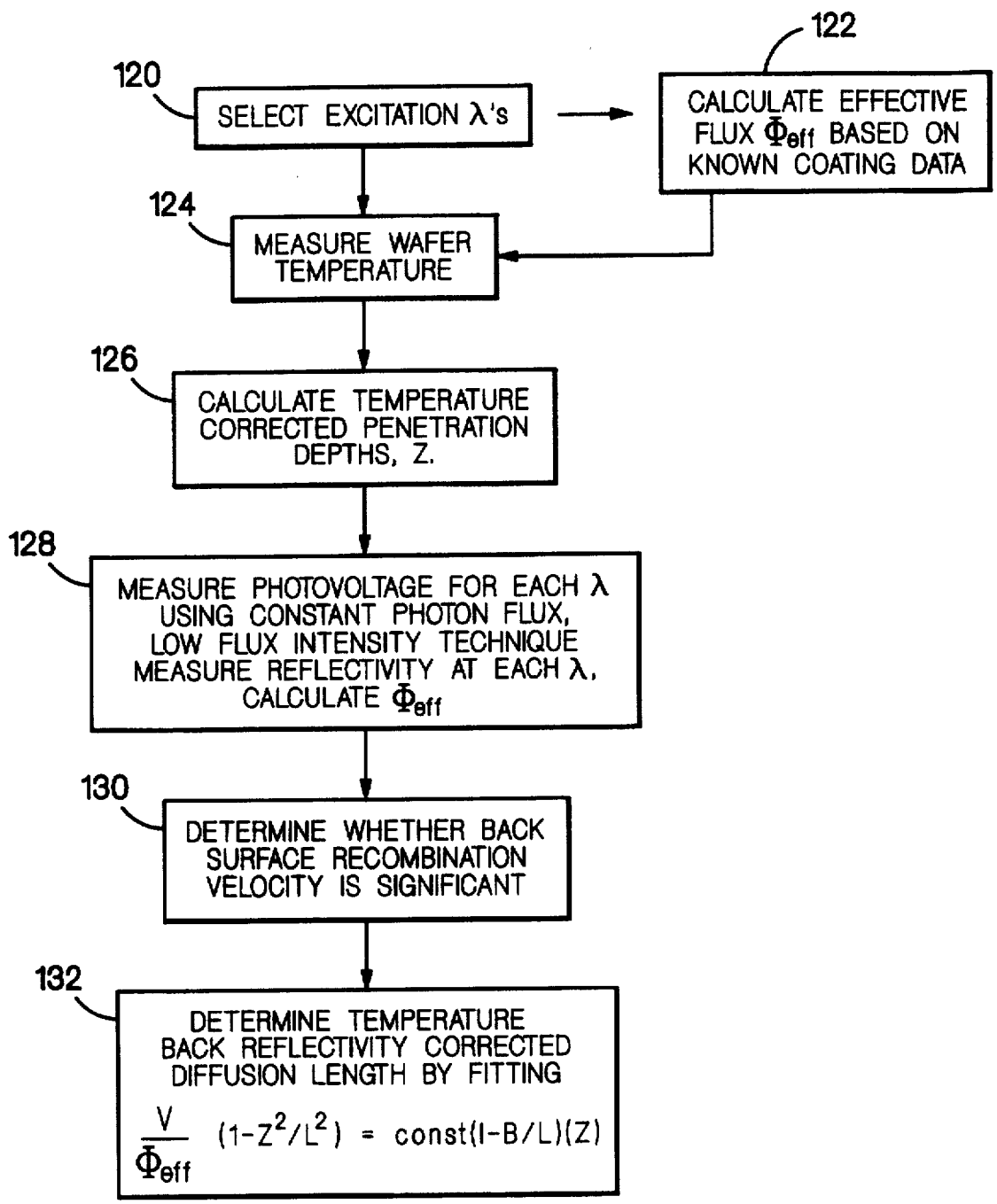
FIG. 6 is a block diagram setting forth steps in a procedure for determining long diffusion lengths.

Referring to FIG. 6, an overview of a procedure for determining long diffusion length is provided. In the first step 120, the user selects the excitation wavelengths. In cases where the user knows the wafer has a coating, and has determined details of the coating, such as thickness and refractive index, the coating data is entered and the effective photon flux for each wavelength, corrected for coating reflectance, is computed and stored 122. The system then measures the wafer temperature 124 and calculates temperature-corrected penetration depths 126. The system next measures the photovoltage for each wavelength in a low flux regime 128, following the procedure used for the standard constant photon flux technique (see Lagowski e.g., U.S. Pat. No. 5,025,145, the entire contents of which are incorporated herein by reference). Using a probe of the type discussed with respect to FIGS. 3 or 4–4a, the system also measure reflectivity at each wavelength and calculates a reflectivity-corrected flux, $\Phi_{ef}$. This measurement is particularly useful when details of the coating are not known or if the coating could be irregular. The system then determines whether the back surface velocity is significant 130, which varies the computation of diffusion length, as will be discussed below. Finally, the system determines the diffusion length 132 by fitting an expression that does not require that the diffusion length be small compared to wafer thickness. The computations of the procedure are discussed in greater detail below.

Diffusion Length Calculation

The diffusion length is calculated by a procedure that employs a rigorous expression which relates a small linear photovoltage signal to the light penetration depth, z, and the minority carrier diffusion length, L, without restriction of diffusion length with respect to wafer thickness. This expression can be derived from the small signal steady-state surface photovoltage treatment set forth in Frail et al. *Surf. Sci.* 6, 115, (1966) and Ulmer et al., *J. Appl. Phys.* 52, 407 (1981), the entire contents of both of which is incorporated herein by reference. The small signal calculation considers illumination as a small disturbance. The relationship between photovoltage, V, and carrier concentration, $\Delta n$, is obtained from the Poisson equation and an electrical neutrality condition. Independently, $\Delta n$ is obtained as a function of the light penetration depth, z, from a steady-state solution of the continuity equation.

In the analyses used here, it is assumed that the shortest light penetration depth (typically 10 µm) is much larger than the width of the surface space charge (0.1 to 0.3 µm in 1 to 10 Ωcm silicon, respectively). This simplifies the continuity equation in that the field enhanced transport does not need to be invoked.

The small surface photovoltage expressions may then be written as:

$$V = const \Phi_{ef} f(z) \qquad (3)$$

where $\Phi_{ef}$ is the effective flux of photons entering the semiconductor, i.e., corrected for reflectivity. The function f(z) contains the dependence on penetration depth:

$$f(z) = \frac{1}{1 - z^2/L^2} (1 - (B/L)z) \qquad (4)$$

where:

$$B = \frac{[(v/S_b)\sinh(T/L) + \cosh(T/L)]}{[\sinh(T/L) + (v/S_b)\cosh(T/L)]} \qquad (5)$$

and where $S_b$ is the back surface recombination velocity, v≡D/L, the diffusion velocity, where D is the minority carrier diffusion constant, and T is the sample thickness. The front surface recombination velocity, $S_f$, reduces the surface photovoltage at the same ratio for all light penetration depths, therefore, it is included in the constant in Equation (3) and need not be separately determined.

Equations 3 and 4 can be rewritten as:

$$\frac{V}{\Phi_{\text{eff}}} (1 - z^2/L^2) = \text{const}(1 - B/L)z \qquad (6)$$

Experimental data can be fit to this expression to determine diffusion length, L. The fitting parameter B is dependent not only on diffusion length, L, but also on the value of the surface recombination velocity on the back surface, $S_b$. Assuming that the contribution from recombination on the back surface is significant, i.e., $S_b \gg D/L$, then fitting parameter reduces to:

$$B = \cos h \, (T/L)/\sin h \, (T/L) \qquad (7)$$

In this case, the fitting procedure involves a single parameter, diffusion length L. Calculation of diffusion length using this single parameter fitting is also discussed in Lagowski et al., *Appl. Phys. Lett.*, 63(21), 22 Nov. 1993, p. 2902, the entire contents of which is incorporated herein by reference. The condition that the back surface recombination velocity is much greater than the diffusion velocity is typically satisfied in silicon wafers that have received standard chemical cleaning treatments such as polishing and etching (e.g., SC-1 and SC-2). In cases where the back surface recombination velocity is not negligible, e.g., for wafers with coated surfaces, such as back surface oxidized wafers, the measurement can still be made stripping the oxide from a sample wafer using $HF:H_2O$ etching which also creates high surface recombination velocity.

Figure 7:
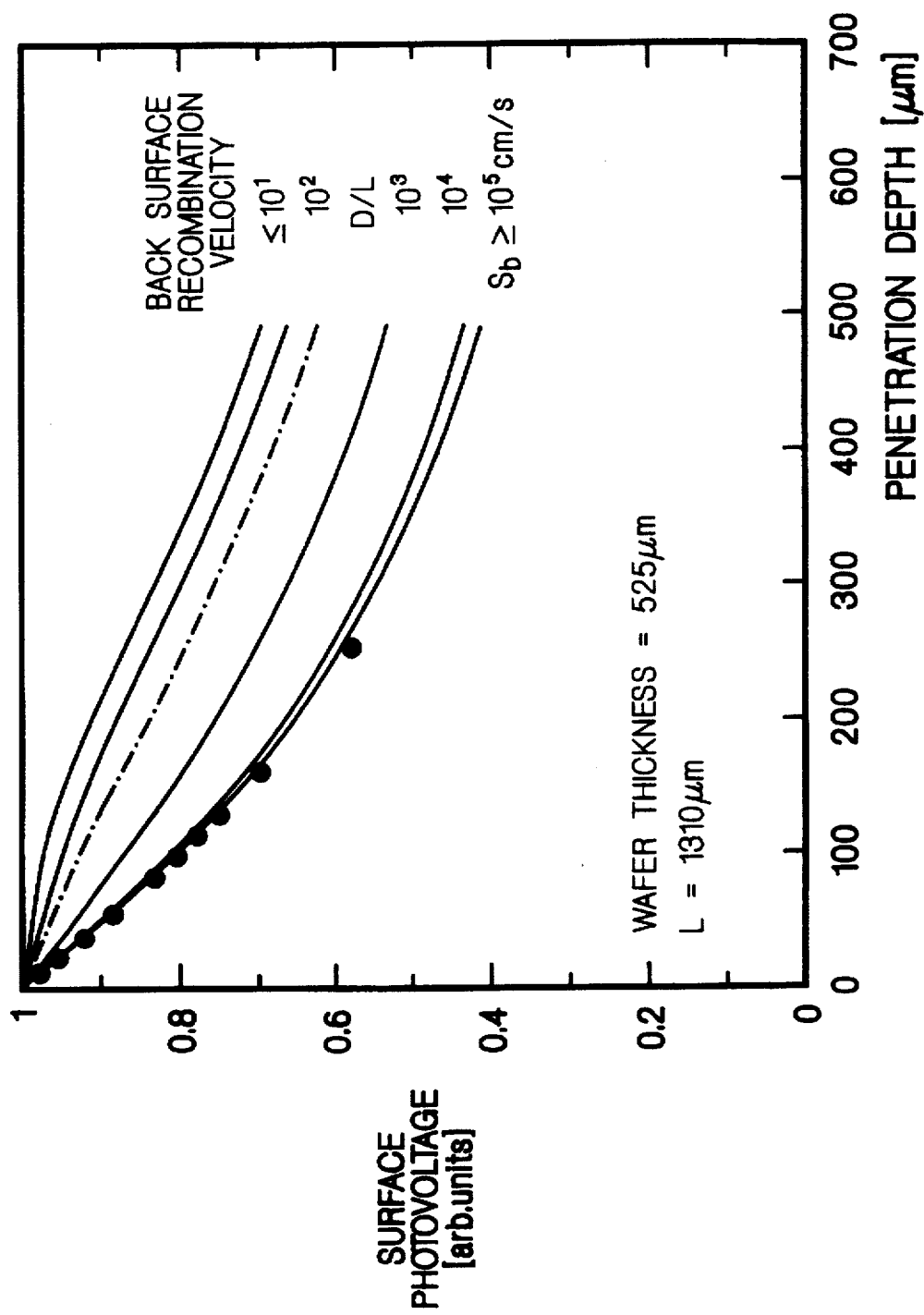
FIG. 7 is a plot of photovoltage versus penetration depth for different surface recombination velocities.

The system may be constructed to determine whether wafers satisfy the condition for single parameter fitting. Referring to FIG. 7, a plot of voltage versus penetration depth, cases of high and low back surface recombination velocity can be distinguished by determining whether voltage versus penetration depth curves generally are convex or concave. For example, wafers with a back surface layer of $SiO_2$, which are characterized by low back surface velocities typically between 10–1000 cm/sec, can be detected using this technique.

Figure 13:
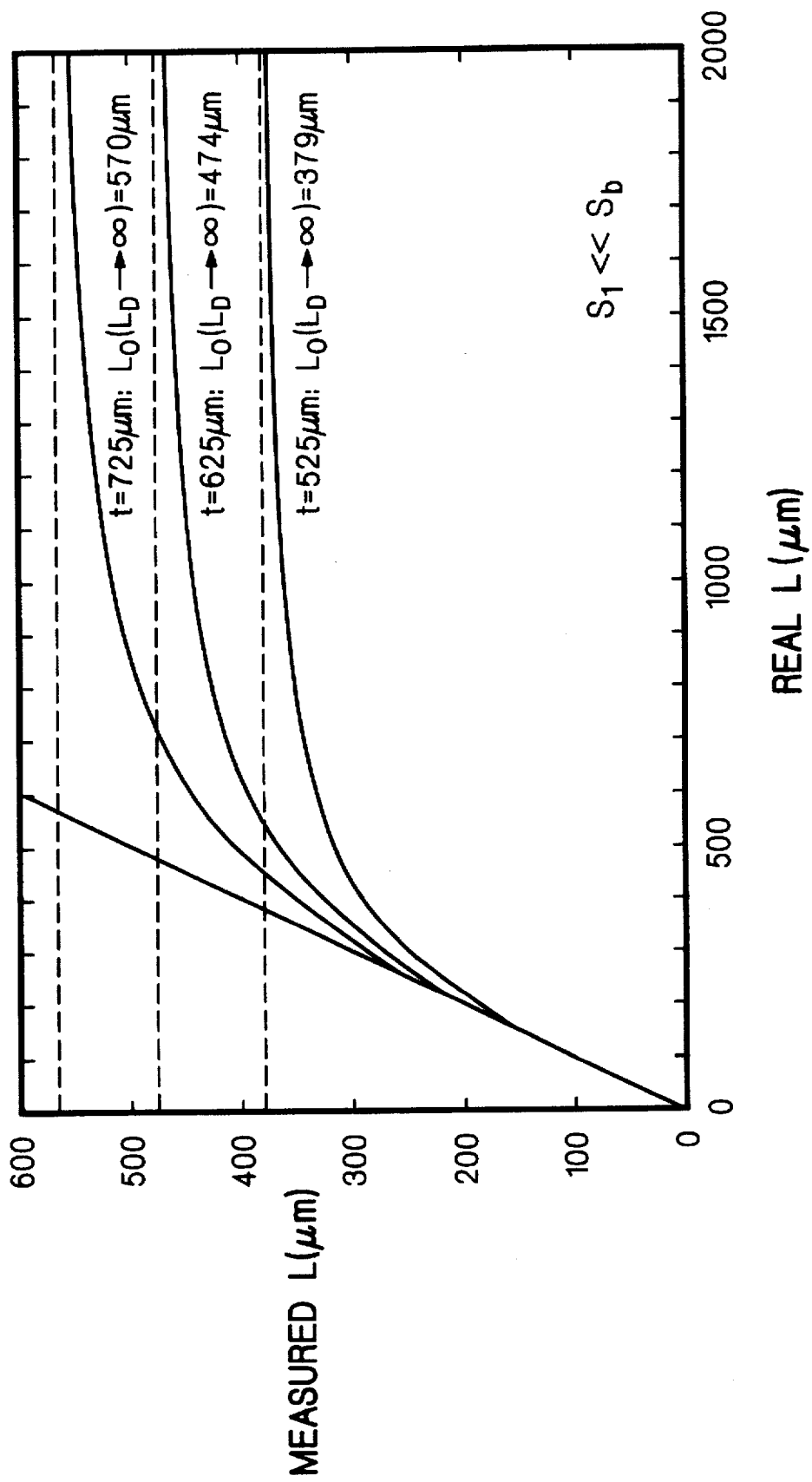

In a further improvement, wafers with low back surface recombination velocities can also be analyzed. In this case two parameters, L and B, are determined using a best fit to Equation (6). The fitting of data in FIG. 13 was done using a Pascal program described in "Numerical Recipes in Pascal" by W. H. Press, B. P. Flannery, et al. Cambridge University Press, 1992, ch.9, p.274 the entire contents of which is incorporated by reference. The fitting uses bracketing and bisection to find L and B values which give a minimum of the square deviation sum $$f(L,B) = \sum_i [V_{im}(Z_i) - V_{ic}(Z_i,L,B)]^2 \qquad (8)$$

where $V_{im}$ is the measured photovoltage for given penetration depth $Z_i$ (at wavelength $\lambda_i$) and $V_{ic}$ is the calculated photovoltage as given by equation 6. After L and B are determined the quality of the fitting is judged by the linearity of the plot of $(1-z^2/L^2)V/\Phi_{\text{eff}}$ as a function of penetration depth z using correlation factor similar to that used in a linear regression method. During typical measurements with seven different wavelengths the fitting is considered reliable if the correlation factor exceeds 0.990.

Reflectivity Compensation

The system can also be constructed to correct for changes in surface reflectivity caused, for example, by a dielectric film on the wafer surface or different surface coatings, such as slicides, poly-silicon, or metal films.

Figure 8:
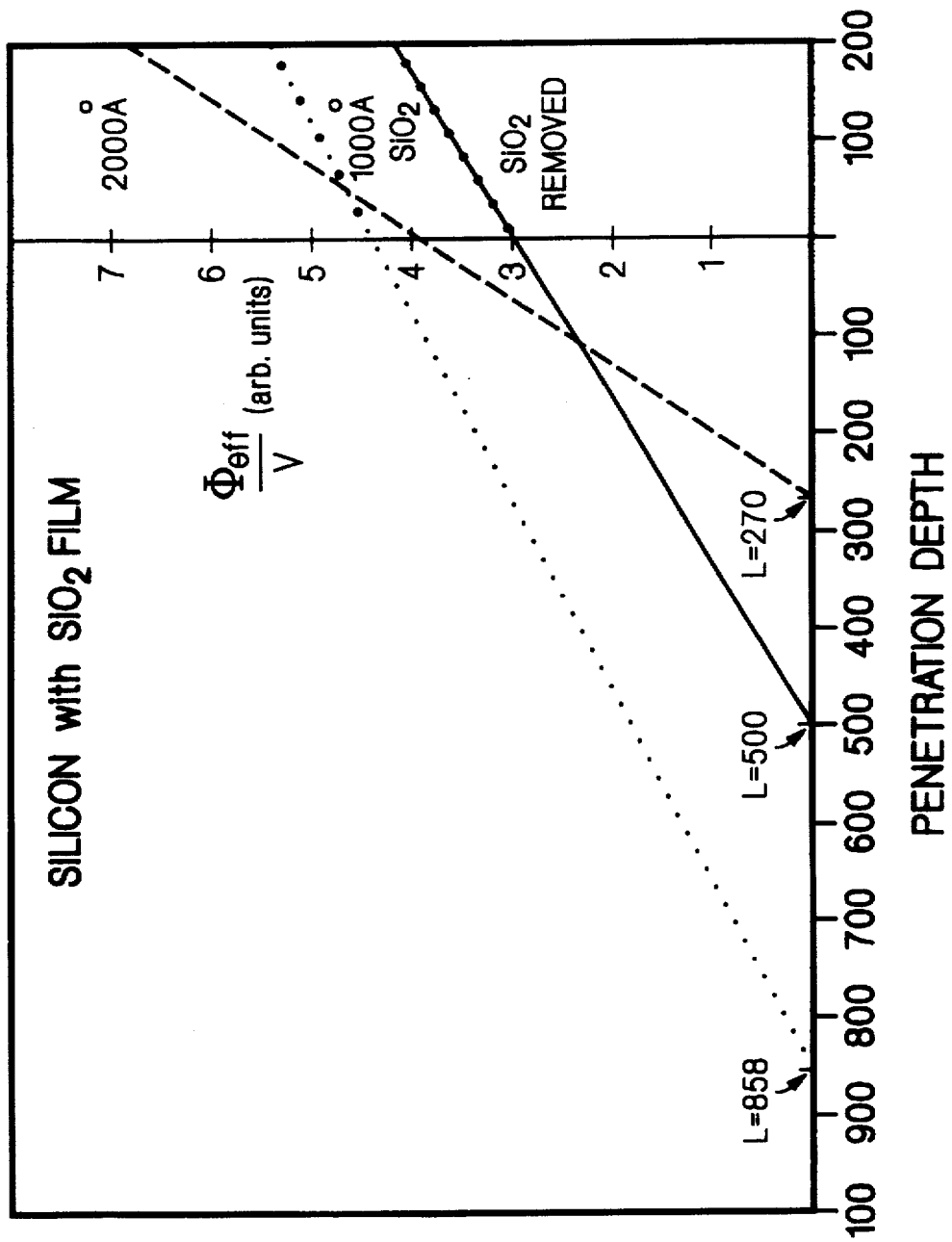
FIG. 8 is a plot of inverse photovoltage as a function of penetration depth (used in standard computation techniques) that compares the diffusion length calculated for a portion of a wafer that is uncoated to the diffusion length calculated for portions of the same wafer that are coated with silicon dioxide films.

Referring to FIG. 8, a plot of photovoltage as a function of penetration depth is provided that compares diffusion lengths calculated by standard techniques without reflectivity correction for a portion of a wafer that is uncoated and for portions of the same wafer that are coated with silicon dioxide films (1000 Å and 2000 Å thick, respectively). As the plots indicate, the presence of the film strongly effects the calculated diffusion length.

To correct for such errors, corrected reflectivity values R' are found for each wavelength and used to correct the surface photovoltage by replacing standard $V/\Phi'_{\text{eff}}$ by:

$$V/\Phi'_{\text{eff}} = \frac{V(1-R)}{\Phi_{\text{eff}}(1-R')} \qquad (9)$$

where $R = (1-n_2)^2/(1+n_2)^2$ and where $n_2$ is the refractive index for the semiconductor (e.g., silicon) in the wavelength range of 0.8 μm to 1.04 μm, which is assumed to be substantially a constant, ($n_2 = 3.42$ for silicon). For very high precision, second order corrections can be used for slight wavelength dependence on $n_2$ and are available in the literature.

After replacing $\Phi_{\text{eff}}$ by $\Phi'_{\text{eff}}$, the diffusion length, L, is obtained from the plot of $V/\Phi'_{\text{eff}}$ as a function of the penetration depth, z, in either the methods above, suitable for long diffusion lengths, or in the standard methods, suitable for short diffusion lengths compared to the wafer thickness.

To correct for reflectivity when using a probe such as shown in FIG. 3, calibrating measurements are performed for all wavelengths using an uncoated silicon wafer and a non-reflecting black plate to determine corresponding detector signals $I_1$ and $I_2$. The signal $I_2$, from the non-reflecting back plate, contains a contribution from light reflected only from the quartz substrate, while the signal $I_1$, from the uncoated wafer, contains, in addition, a contribution from light reflected from the wafer. The characteristic data, $I_1$ and $I_2$, are stored and used to evaluate the unknown reflectivity, (1–R'), of a wafer under analysis, such as a wafer with a dielectric coating. If $I_3$ is the signal detected with the wafer including a coating, then the reflectivity correcting factor, (1–R'), becomes:

$$1 - R' = (1 - R)\frac{I_3 - I_1}{I_1 - I_2} \qquad (10)$$

An alternate approach for reflectivity correction can be used in cases where film refractive index, $n_1$, and thicknesses, t, are known (e.g., from measurements, such as with an ellipsometer). The system calculates new reflectivity values for every wavelength, λ, based on a standard thin-film formula:

$$R'(\lambda) = \frac{r_1^2 + r_2^2 + 2r_1r_2 \cdot \cos(4\pi n_1 d_1/\lambda + \pi)}{1 + r_1^2 r_2^2 + 2r_1 r_2 \cdot \cos(4\pi n_1 d_1/\lambda + \pi)} \qquad (11)$$

$$\text{where } r_1 = \frac{1 - n_1}{1 + n_2}, \; r_2 = \frac{n_1 - n_2}{n_1 + n_2},$$

$n_2$ is the refractive index for, e.g., silicon, which in the wavelength range 0.8 μm to 1.04 μm can be taken as independent of the wavelength and equal to 3.42. If very high precision is needed, second order corrections to $n_2$ are available in published literature.

Temperature Compensation

Minority carrier diffusion length in silicon is insensitive to small temperature changes near room temperature. From theoretical predictions, which are given in more detail in Appendix A, below, diffusion length decreases slightly with increasing the temperature at about 0.15% or less per 1° C. However, in standard surface photovoltage methods, temperature increases can produce increases of diffusion length as high as 2% per 1° C. For example, during the course of an analysis of a wafer for iron contamination (a significant lifetime limiting contaminant for silicon wafers), the wafer is typically irradiated with 10 to 100 joules per measured region. This energy is dissipated as heat and, in a typical nine points per wafer measurement over a series of wafers, the wafer chuck temperature may rise by as much as 5° C., which can obscure detection of low iron concentrations.

The magnitude of the diffusion length variation increases with increasing diffusion length value. This effect is due to changes of the light penetration depth which are not taken into account in standard analyses. The penetration depth, z, decreases (increases) upon increasing (decreasing) the temperature. In standard methods, penetration depth values are obtained only for one temperature, 293 K. As a result, a temperature increase produces an apparent increase in diffusion length while lowering of temperature results in diffusion length smaller than actual. For wafers with diffusion lengths of about 700 µm, this effect produces variation of diffusion length as large as 2% per 1° C., a limitation to the accuracy of the methods and, hence, to the sensitivity of detection of contaminants.

In this approach, the temperature effect is corrected by correction of the penetration depth as a function of temperature. An empirical formula has been derived for the light penetration depth as a function of wafer temperature:

$$z=[84.732/\lambda+(0.110/\lambda-0.068)(T_w-293)-76.417]^{-2} \quad (12)$$

In this formula, z and λ are in micrometers while the wafer temperature, Tw, is in Kelvin degrees. Calculation of the absorption coefficient is discussed generally in H. A. Weakliem et al., *J. Appl. Phys.*, Vol.50, P.1491, (1979).

Wafer temperature is measured with accuracy of 0.1° C. using a contact type temperature sensor (resistive or thermocouple) mounted in the wafer chuck just below the surface or a non-contact sensor (pyroelectric sensor or other infrared detector) mounted above the wafer surface next to photovoltage pick-up probe. A value of the penetration depth at each wavelength is calculated from equation (12) and used in equation (6) to determine diffusion length in the long diffusion length case or in equation (1) in the case of short diffusion lengths.

Figure 9:
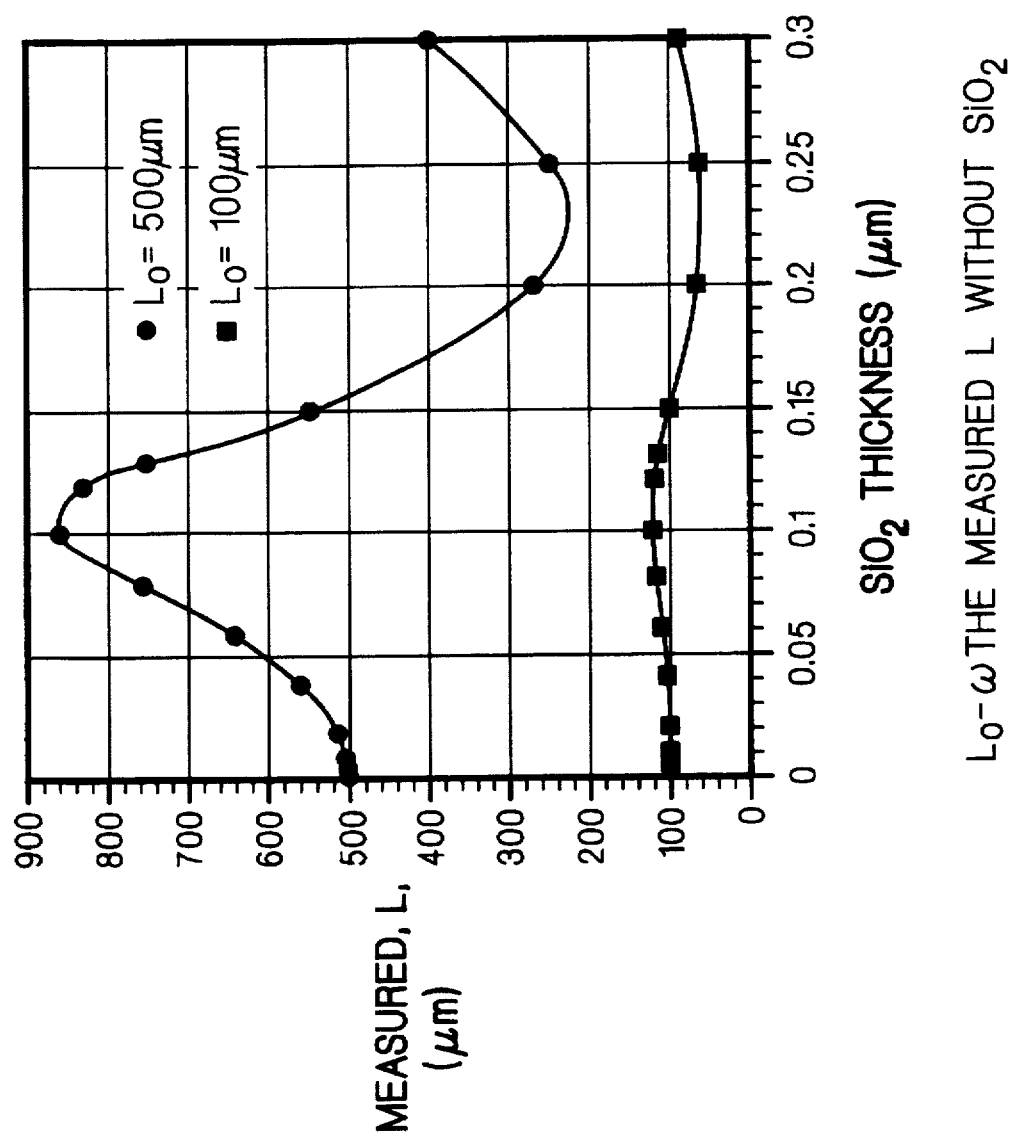
FIG. 9 is a plot of diffusion length as a function of measurement temperature for temperature-corrected and uncorrected data.

Referring to FIG. 9, the effectiveness of new procedure in compensating for errors due to changes in the measurement temperature is demonstrated in a plot of diffusion lengths calculated by the standard method as a function of temperature using uncorrected and corrected penetration depths.

EXAMPLE

Referring to FIG. 10, a plot of the photovoltage as a function of penetration depth computed by standard methods for wafers of equal diffusion length but different thicknesses indicates that significant error in diffusion length measurements is inherently present when the diffusion length is comparable to the wafer thickness. In this case, a thick 2000 µm slab of high purity silicon, measured using the constant photon flux method, gave a diffusion length of 743 µm. This diffusion length is about one third of the wafer thickness, therefore, the use of Equation (1) is satisfied and the value can be treated as correct. The slab was then thinned to a thickness of 490 µm which is approximately the thickness of current 4" diameter silicon wafers. Measurements on this wafer using the standard constant photon flux method gave diffusion length of only 332 µm, which equals about 0.7 times the wafer thickness. Not only is the measurement of long diffusion length on thin wafers incorrect, but furthermore, the method is very deceiving. Experimental points appear to satisfy the linear dependence predicted by Equation (1) very well. Accordingly, when using the standard methods, the operator cannot judge from the plot whether the diffusion length is correct.

Figure 11:
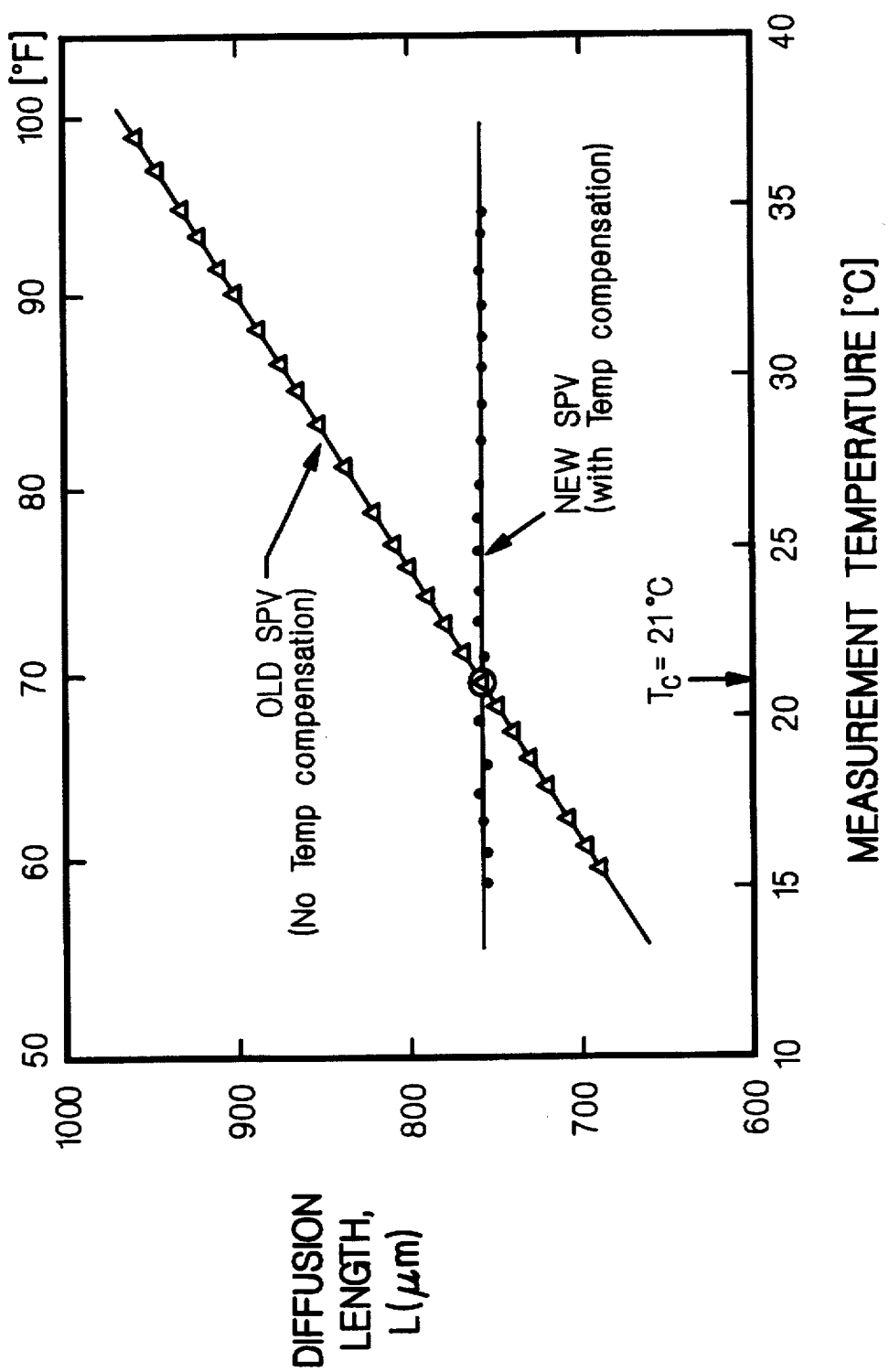
FIG. 11 is a plot of measured diffusion length, using standard methods, as a function of actual diffusion length for various wafer thicknesses and diffusion lengths.

Referring to FIG. 11, the limitations of the standard approaches in measuring long diffusion length are illustrated. It is seen that, only for diffusion lengths lower than half of the wafer thickness, does the measured diffusion length equal the real diffusion length value. For higher diffusion lengths, the measured value becomes significantly underestimated and it levels at a value of about 370 µm for 4" wafers with a thickness of 525 µm and at a value of about 550 µm for the advanced 8" wafers with a thickness of 725 µm. In order to reliably monitor clean processing with standard methods, test slabs, perhaps as thick as 3 mm, rather than standard wafers should be analyzed if standard techniques are to be used.

For determining the diffusion length using equation (8), photovoltage data is collected using the linear constant photon flux method, i.e., the photovoltage is measured for several wavelengths of incident light at low flux (e.g., about $10^{12}$ photons/cm² sec). A typical number includes seven to nine wavelengths which, for silicon, cover the range from 1.025 µm to 0.800 µm. At room temperature, this corresponds to light penetration depths from 256 µm to 11.5 µm. (The minimum number of wavelengths needed for determining diffusion length is two, in the case of high back surface recombination velocity, and three in the case of intermediate or low back surface recombination velocity values. (The accuracy of the procedure increases with an increased number of wavelengths.) The spectral bandwidth of the incident light should be less than 10 nanometers, preferably about 3 to 5 nanometers. In the case of a 10 nm band centered at 1.025 µm, the corresponding bandwidth of light penetration extends from 225 µm to 292 µm, which is generally not preferred. If the bandwidth is reduced to 3 nm, the penetration depth range is reduced to 246 µm to 256 µm to increase the measurement accuracy. The spectral bandwidth can be selected by using appropriate filters (e.g., available from Andover Corp., Salem, N.H.)

An example of the procedure will be given using seven wavelengths, $\lambda_1$ to $\lambda_7$. The operator introduces information about the surface coating, if known. The corrections for flux, $\Phi_{eff}$, are calculated or measured by the system for every wavelength. If calculated, the corresponding values of corrected flux $\Phi'_{eff}$ are stored in the computer. If measured, using a probe that simultaneously measures reflectance as and photovoltage, then the corrected flux $\Phi'_{eff}$ is determined using experimental 1−R' values (equation (9)). Upon initialization of the measurements, the system reads the wafer temperature and calculates the light penetration depths corresponding to every wavelength. The photovoltage is then measured and the data is analyzed done using three sets of values: $V_1$ through $V_7$; $\Phi_{eff1}$ through $\Phi_{eff7}$; and $z_1$ through $z_7$. The photovoltage, $V/\Phi'_{eff}(z)$, normalized to corrected photon fluxes, is then used for determining diffusion length L and B by numerical fitting of data to Equation (6). The data is then displayed in the form of plot photovoltage as a function of penetration depth which is analyzed to determine the quality of the fitting procedure. Quantitative evaluation of the fitting procedure is provided by the value of the correlation factor, R, which, for good quality reliable data, should exceed 0.990.

Figure 12:
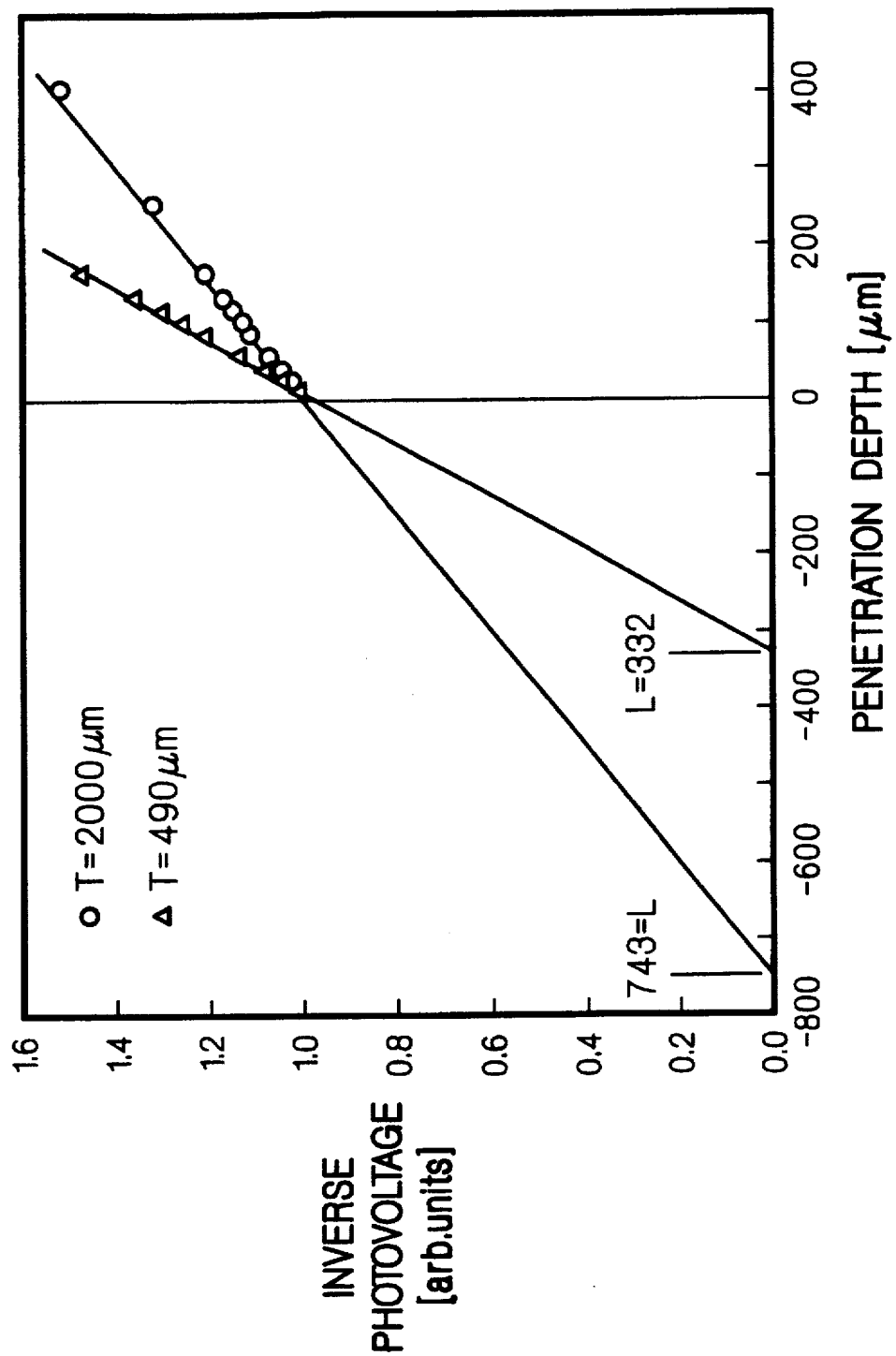
FIG. 12 is a plot of surface photovoltage as a function of penetration depth as determined by methods of the invention.
Figure 14:
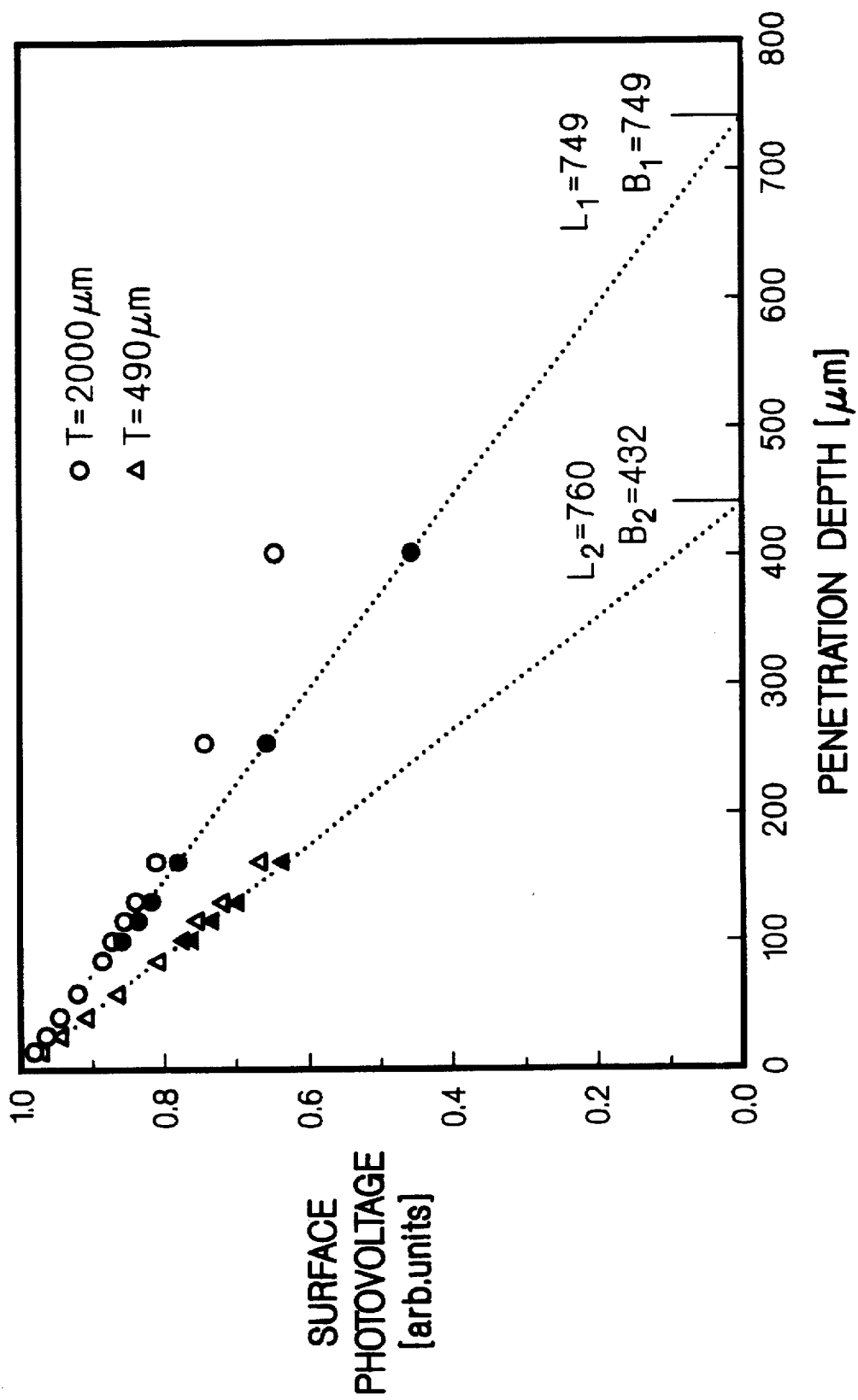

Referring to FIG. 12, data from the new procedure is illustrated. The experimental data in this figure is exactly the same as that of FIG. 9, where the data were interpreted in terms of the standard method which lead to a significant underestimate of diffusion length after thinning of the slab. Open symbols in FIG. 14 represent the photovoltage value divided by the photon flux, $V/\Phi_{\mathit{eff}}$. The filled symbols represent $(1-z^2/L^2)V/\Phi_{\mathit{eff}}$. In accord with Equation (8), these latter plots perfectly satisfy the linear relationship. The diffusion lengths $L_1$=749 µm and $L_2$=760 µm obtained in this manner for a 2000 µm slab and a 490 µm thick wafer, respectively, are substantially the same. It is evident that this approach correctly gives diffusion lengths larger than the thickness of the measured wafer.

Further embodiments are in the following claims.

What is claimed is:

1. A system for measuring minority carrier diffusion length, L, of a semiconductor sample, comprising:
    a light source for producing radiation at a plurality of wavelengths,
    a wavelength selector for providing radiation at a series of select wavelengths, and
    a probe for illuminating a region of said sample with said radiation at said series of select wavelengths and measuring a photovoltage induced by said radiation at said series of select wavelengths, said probe including a transparent substrate arranged to be placed in proximity with said semiconductor surface and a transparent detection element disposed over said substrate in the path of said radiation, wherein said illuminated region of said sample has a diameter, $d_2$ that is larger than a diameter $d_3$ of said detection element.

2. The system of claim 1 wherein said detection element is spaced from the edge of said substrate by a distance that exceeds a minority carrier diffusion length associated with said semiconductor sample.

3. The system of claim 2 wherein said transparent detection element is disposed in a central portion of the transparent substrate in the form of a continuous circular region and sized such that:

$(d_2-d_3)/2>L$.

4. The system of claim 3 wherein said probe is constructed for measurement of semiconductors with minority carrier diffusion lengths of about 1 mm or more.

5. The system of any one of claims 1, 3, or 4 wherein $d_3$ is about 6 mm.

6. The probe of claim 1 wherein said surface charge effect is a surface photovoltage and said detection element is a transparent electrode material covering a portion of said substrate for detecting said photovoltage.

7. The probe of claim 6 wherein said electrode material is in a generally circular region spaced from the edge of said substrate and covering a sample-facing surface of said substrate.

8. The probe of claim 6 or 7 wherein said electrode material is spaced at least about 1 mm from the edge of the substrate.

9. The probe of claim 6 or 7 wherein said electrode material is spaced about 3 mm from the edge of said substrate.

10. The probe of claim 9 wherein said electrode material has a diameter of about 6 mm.

11. A system for measuring minority carrier diffusion length, L of a semiconductor sample, said system comprising:
    a light source for producing radiation at a plurality of wavelengths, said light source including,
    a wavelength selector for providing radiation at a series of select wavelengths, and
    a probe including a detection element positioned in proximity with a surface of said semiconductor sample to detect a photovoltage, said probe constructed to both direct radiation onto said surface and receive radiation reflected from said surface, said probe including a fiber optic bundle including a first series of fibers having a second end arranged to receive radiation from a source and a first end arranged in proximity with said semiconductor surface to direct said radiation onto said surface to induce said photovoltage, and said fiber optic bundle including a second series of fibers having a first end in proximity to said surface to receive radiation reflected from said surface, said second series of fibers having a second end to direct said reflected radiation onto a detector.

12. The device of claim 11 wherein said first and second series of fibers are intertwined at respective first ends in proximity with said surface and separated at said respective second ends.

13. The device of claim 12 wherein said detection element comprises a transparent substrate having an electrode positioned in proximity with said surface and excitation radiation from said first end of said first series of fibers and reflected radiation from said first end of said second series of fibers pass through said transparent substrate.

14. A device for measuring photovoltage and reflectivity of the surface of a semiconductor, comprising
    a probe for directing radiation along a path for illuminating an area of said semiconductor with radiation to excite charge carriers and create a surface photovoltage, said probe including a transparent substrate and a transparent electrode in the path of said radiation and disposed over said transparent substrate through which said radiation passes, said transparent electrode being spaced from the edge of said substrate by a distance that exceeds the carrier diffusion length in said semiconductor for detecting the photovoltage from the excited area of said semiconductor, said probe including a fiber optic bundle including a first series of fibers having one and arranged to be coupled with the transparent substrate in proximity with said semiconductor surface to direct said radiation onto said surface through the transparent electrode to induce said photovoltage, and said fiber optic bundle including a second series of fibers having one end arranged to be coupled with the transparent substrate in proximity to said surface through the transparent electrode to receive radiation reflected from said surface, said second series of fibers having a second end to direct said reflected radiation onto a detector.

15. A method of analyzing a semiconductor sample by determining minority carrier diffusion length, comprising:
    illuminating a region of said semiconductor sample with light at a series of wavelengths,
    controlling the flux of said light to be substantially constant for all wavelengths and at a level where a surface photovoltage of said semiconductor sample is a linear function of said flux,
    measuring photovoltage from said illuminated region of said semiconductor sample;
    analyzing said photovoltages from said illuminating step to determine whether $S_b>>D/L$, where D is the minority carrier diffusion constant, said analyzing step including plotting surface photovoltage as a function of penetration depth and determining whether said function is concave or convex, determining diffusion length by fitting to the expression:

$$\frac{V}{\Phi_{\text{eff}}} (1 - z^2/L^2) = \text{const}(1 - (B/L)z)$$

where V is the photovoltage, z is the penetration depth, L is the diffusion length, $\Phi_{\text{eff}}$ is the flux, and $$B = \frac{[(v/S_b)\sinh(T/L) + \cosh(T/L)]}{[\sinh(T/L) + (v/S_b)\cosh(T/L)]}$$

where $v=D/L$, $S_b$ is the back surface recombination velocity, and T is the sample thickness; and when said function is concave, assuming $S_b>>D/L$, so that
$B=\cosh(T/L)/\sinh(T/L)$
and, fitting L to determine diffusion length and
when said function is convex, fitting B and L to determine diffusion length.

16. The method of claim 15 comprising:
correcting for reflectivity of said semiconductor surface by replacing $V/\Phi_{\text{eff}}$ by:

$$V/\Phi'_{\text{eff}} = \frac{V(1-R)}{\Phi_{\text{eff}}(1-R')}$$

where R' is a correction valve $R=(1-n_2)^2/(1+n_2)^2$, where $n_2$ is the refractive index.

17. The method of claim 16 comprising:
measuring the reflectivity simultaneously with illuminating said wafer, and
correcting for reflectivity by determining:

$$1 - R' = (1-R)\frac{I_3 - I_1}{I_1 - I_2}$$

where $I_1$, is the intensity of light reflected from a standard semiconductor sample, $I_2$ is the intensity of light reflected from other sources, and $I_3$ is the intensity of light reflected from an unknown semiconductor sample.

18. The method of claim 16 comprising:
correcting for reflectivity for a semiconductor including a known coating with a known refractive index and thickness by determining:

$$R'(\lambda) = \frac{r_1^2 + r_2^2 + 2r_1r_2 \cdot \cos(4\pi n_1 d_1/\lambda + \tau\tau)}{1 + r_1^2 r_2^2 + 2r_1 r_2 \cdot \cos(4\pi n_1 d_1/\lambda + \tau\tau)}$$

$$\text{where } r_1 = \frac{1-n_1}{1+n_2}, r_2 = \frac{n_1 - n_2}{n_1 + n_2},$$

$n_2$ is the refractive index for said semiconductor.

19. The method of claims 15 or 18 comprising:
correcting penetration depth for variation with temperature by determining:

$$z'=(84.732/\lambda+(0.1110/\lambda-0.068)(T_w-293)-76.417)^{-2}$$

where Z' is the corrected penetration depth, $T_w$ is the wafer temperature and $\lambda$ is the wavelength of light.

20. The method of claim 15 comprising:
detecting said photovoltages in a subregion spaced from the edges of said illuminated region.

21. The method of claim 20 wherein said illuminated region has a diameter, $d_2$, and said subregion a diameter, $d_3$, and is spaced from the edge of said region such that $(d_2-d_3)/2>L$.

22. A method of analyzing a semiconductor sample by determining minority carrier diffusion length, comprising:
illuminating a region of said semiconductor sample with light at a series of wavelengths,
controlling the flux of said light to be substantially at a level where photovoltage is a linear function of said flux,
measuring photovoltages from said illuminated region of said semiconductor sample;
analyzing said photovoltages to determine whether $S_b>>D/L$,
analyzing said photovoltages from said illuminating step to determine diffusion length by fitting to the expression:

$$\frac{V}{\Phi_{\text{eff}}} (1 - z^2/L^2) = \text{const}(1 - (B/L)z)$$

where V is the photovoltage, z is the penetration depth, L is the diffusion length, $\Phi_{\text{eff}}$ is the flux, and $$B = \frac{((v/S_b)\sinh(T/L) + \cosh(T/L))}{(\sinh(T/L) + (v/S_b)\cosh(T/L))}$$

where $v=D/L$, $S_b$ is the back surface recombination velocity, and T is the sample thickness.

23. The method of claim 22 comprising:
analyzing by assuming $S_b>>D/L$, so that $B=\cos h(T/L)/\sin h(T/L)$ and, fitting L to determine diffusion length.

24. The method of claim 22 comprising:
analyzing by fitting B and L to determine diffusion length.

25. The method of claim 22 comprising:
correcting for reflectivity of said semiconductor surface and by replacing $V/\Phi_{\text{eff}}$ by $$V/\Phi'_{\text{eff}} = \frac{V(1-R)}{\Phi_{\text{eff}}(1-R')}$$

where R' is a correction valve, $R=(1-n_2)^2/(1+n_2)^2$, where $n_2$ is the refractive index.

26. The method of claim 25 comprising:
measuring the reflectivity simultaneously with illuminating said wafer and correcting for reflectivity by determining:

$$1 - R' = (1-R)\frac{I_3 - I_1}{I_1 - I_2}$$

where $I_1$, is the intensity of light reflected from a standard semiconductor sample, $I_2$ is the intensity of light reflected from other sources, and $I_3$ is the intensity of light reflected from a semiconductor sample.

27. The method of claim 25 comprising:
correcting $\Phi_{\text{eff}}$ for reflectivity for a semiconductor including a known coating with a known refractive index and thickness by calculating reflectivity using the thin film formula:

$$R'(\lambda) = \frac{r_1^2 + r_2^2 + 2r_1r_2 \cdot \cos(4\pi n_1 d_1/\lambda + \tau\tau)}{1 + r_1^2 r_2^2 + 2r_1 r_2 \cdot \cos(4\pi n_1 d_1/\lambda + \tau\tau)}$$

-continued $$\text{where } r_1 = \frac{1-n_1}{1+n_2}, r_2 = \frac{n_1-n_2}{n_1+n_2},$$

$n_2$ is the refractive index for said semiconductor.

28. The method of claim 22 or 27 comprising:

correcting penetration depth for variation from room temperature by:

$$z'=(84.732/\lambda+(0.110/\lambda-0.068)(T_w-293)-76.417)^{-2}$$

where z' is the corrected penetration depth, $T_w$ is the wafer temperature and $\lambda$ is the wavelength of light.

29. The method of claim 22 comprising:

detecting said photovoltages in a subregion spaced from the edges of said illuminated region.

30. The method of claim 29 wherein said illuminated region has a diameter, $d_2$, and said subregion a diameter, $d_3$, and is spaced from the edge of said region such that $(d_2-d_3)/2>L$.

* * * * *